United States Patent [19]

Niimi et al.

[11] 4,288,728
[45] Sep. 8, 1981

[54] ELECTRIC VEHICLE CONTROL APPARATUS

[75] Inventors: Masayoshi Niimi, Toyota; Koshi Torii, Iwakura; Hidetoshi Kato, Anjo, all of Japan

[73] Assignee: Nippondenso Co., Ltd., Kariya, Japan

[21] Appl. No.: 24,367

[22] Filed: Mar. 27, 1979

[30] Foreign Application Priority Data

Mar. 31, 1978 [JP] Japan .................................. 53/38686

[51] Int. Cl.³ ............................................. B60L 11/18
[52] U.S. Cl. ..................................... 318/139; 318/373; 361/386
[58] Field of Search ............. 361/386, 388; 310/68 D; 174/52 PE, 16 HS; 363/141, 144; 318/139, 373; 351/81

[56] References Cited

U.S. PATENT DOCUMENTS

| | | | |
|---|---|---|---|
| 3,428,871 | 2/1969 | Scott et al. | 357/81 |
| 3,476,981 | 11/1969 | Burton et al. | 361/388 |
| 3,486,103 | 12/1969 | Boksjo | 357/81 |
| 3,538,362 | 11/1970 | Cheetham et al. | 310/68 D |
| 3,729,664 | 4/1973 | Montross | 357/81 |
| 3,739,210 | 6/1973 | Bahlinger et al. | 310/68 D |
| 3,778,650 | 12/1973 | Tharman | 361/388 |
| 4,161,016 | 7/1979 | Born et al. | 361/386 |

FOREIGN PATENT DOCUMENTS 1088375 10/1967 United Kingdom ............ 310/68 D

*Primary Examiner*—David Smith, Jr.
*Attorney, Agent, or Firm*—Cushman, Darby & Cushman

[57] ABSTRACT

An electric vehicle control apparatus fixed onto an electric vehicle body and including at least a main semiconductor device and a flywheel diode comprises a base member thereof fixed onto said vehicle body being in close contact therewith, a heat sink made of a metallic plate and fixed onto a portion of said base member through a thin sheet of an insulating material intervening therebetween, at least two pellets fixed directly onto said heat sink which pellets constitute at least said main semiconductor device and said flywheel diode, connecting terminals each thereof mounted on each of said pellets, and at least one auxiliary electric device fixed onto said heat sink.

12 Claims, 10 Drawing Figures

FIG. 1

ELECTRIC VEHICLE CONTROL APPARATUS

The present invention relates to a control apparatus for electric vehicles which includes a thryristor chopper for controlling a DC motor of an electric car, a battery-powered fork lift or the like by a chopping operation.

In conventional chopper circuits, diodes or thyristors are arranged in the bridge form. There has been a desire for a reduction in size, weight and cost of the apparatuses which employ such circuits.

This type of known thyristor chopper circuit for DC motors comprises a main thyristor, a commutating diode, a flywheel diode, etc. However, heat sinks for these thyristors and diodes have been separately manufactured and combined with the thyristors and diodes afterwards. It has been difficult to mount such elements on a single or common heat sink for the following reasons.

While studs of such diodes electrically act as anodes and those of other diodes act as cathodes, studs of thyristors act only as anodes. Further, a commutating capacitor is connected between an anode of a main thyristor and that of a commutating thyristor, so that it has been impossible to mount anodes of main and commutating thyristors on one and the same heat sink thereby giving them the same electric potential.

Even if a main thyristor for controlling a DC motor, a commutating thyristor, etc. were mounted together on one and the same heat sink and a common insulating cover were disposed thereon, it would be no more than mere gathering of a plurality of separate heat sinks in one place, so that only a limited reduction in the size of the heat sink would be possible. As compared with mass-produced stud diodes and thyristors, studless diodes, etc., each of which is formed essentially only as a pellet and put into practical use nakedly, has a special construction and is expensive. Therefore, it has been considered that while the concept of arranging such elements on a common heat sink can be embodied in a chopper circuit employing diodes and/or thyristors connected in the form of a simple three-phase full-wave rectifier bridge, it has been considered difficult to embody the concept in a chopper circuit comprising a main thyristor, a commutating thyristor and a flywheel diode and adapted to drive a DC motor which is mainly applied to electric vehicles or battery-powered fork lifts.

The inventors found the following facts in the course of devising this invention.

It was found that, if a main thyristor, a commutating diode and a commutating capacitor are arranged on a single heat sink by using a newly devised connection, the conduction period of the main thyristor is in exactly opposite relation to that of the flywheel diode, in other words, no matter in what a pattern a battery-powered fork lift may be operated, for example, the amount of heat generation by the main thyristor with time and that of the flywheel diode can be in mutually compensating relation, i.e., in a complementary mode, so that a decrease in the amount of heat generated by one of them during a certain time period can be made up by an increase in the amount of heat generated by the other (this relation will hereinafter be referred to as a complementary relation). Thus, it was found that by arranging a main thyristor and a flywheel diode side by side on a single common heat sink, it is possible to allow the single heat sink to fully perform its heat dissipating function and greatly reduce the volume of the heat sink. It is impossible to think of the above-mentioned fact from the prior art technical concept of getting a compact arrangement by mere gathering of heat sinks in one place. The present invention is based on this concept.

Thus, it has been made possible to provide an electric vehicle control apparatus in which each of semiconductor elements in the pellet or bare form is mounted on a common heat sink so as to quickly transmit heat generated by a main thyristor and a flywheel diode to the common heat sink and thereby to prevent any localized heating of members near the pellets due to poor heat conduction, and further the abovementioned complementary relation in heat generation between the main thyristor and the flywheel diode is skillfully utilized to greatly reduce the size of the heat sink and still maintain the pellets at low temperatures, thus remarkably reducing the size and weight of the apparatus as a whole and thereby reducing the cost of the apparatus.

It is therefore a first object of the invention to provide an electric vehicle control apparatus comprising a power module in which generated heat is transmitted in a complementary mode to a common heat sink and is dissipated thereby and at the same time the heat transmitted to the heat sink is made to flow quickly and smoothly, whereby the temperature rises of the pellets of diodes and thyristors are kept at low values, and thus the elements can be arranged compactly on a small heat sink.

It is a second object of the invention to provide an electric vehicle control apparatus which comprises a power module having sufficient mechanical strength, in which the arrangement of elements on the heat sink is improved to ensure an improved heat dissipating operation, and which is small in size and economical.

It is a third object of the invention to provide an electric vehicle control apparatus in which the feature of the reduced size and height of the power module is utilized to make it possible to arrange other electric components above the power module, thus reducing the size of the apparatus as a whole.

The above and other objects, features and advantages of the invention will be made apparent from the following descriptions taken in conjunction with the accompanying drawings, in which:

FIG. 1 is a circuit diagram showing an embodiment of an electric circuit of an electric vehicle control apparatus of this invention;

The present invention will now be described in detail with reference to the illustrated embodiments.

Figure 2:
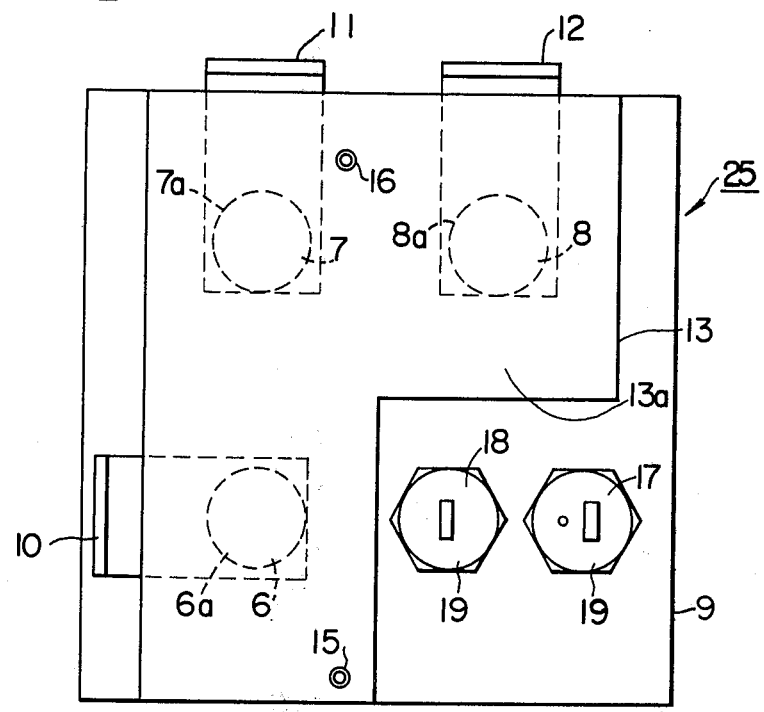
FIGS. 2 and 3 are respectively a plan view and an elevation showing an assembly of semiconductor elements used in a first embodiment of the apparatus of this invention.
Figure 3:
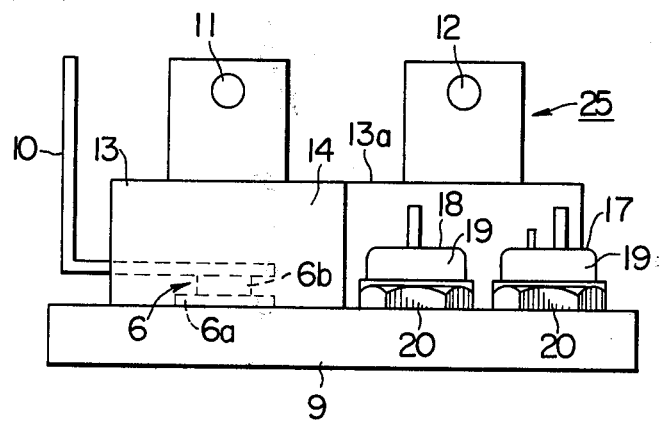

Referring to FIGS. 1 to 5 showing a first embodiment of this invention, numeral 1 designates an armature of a DC motor for driving an electric vehicle, 2 a motor field coil, 3 and 4 electromagnetic switches, 5 a battery operating as a vehicle power source, and 6 a main semiconductor device, particularly a main thyristor having a current rating of about 200 A. Numeral 7 designates a flywheel diode, and 8 a plugging diode. These elements constitute large capacity semiconductor devices 6, 7 and 8 each of which is mainly composed only of a pellet proper, and these devices are directly fixed onto a metallic plate 9, which acts as a common electrode and is hereinafter referred to as a heat sink, with fastening clamps or by brazing or soldering. In FIG. 3, numeral 6a designates a pellet of one of the semiconductor devices and 6b a metallic spacer thereof. The metallic plate 9 also serves as a cooling medium for absorbing heat from the pellets and is made of copper or aluminum. It is to be noted that the spacing between the flywheel diode 7 and the plugging diode 8 is made smaller than that between the main thyristor 6 and the flywheel diode 7.

Numerals 10, 11 and 12 designate bars, particularly copper bars constituting connecting terminals one end of each of which is connected to one of the pellets of the large capacity semiconductor devices 6, 7 and 8 and the other end of each of which is folded into an L-shape and led to the outside of cover means 13. The cover means 13 is in particular made of an iron plate to protect the pellets 6a, 7a and 8a and covers the pellets 6a, 7a and 8a. A molding synthetic resin 14 is put into the space between the cover means 13 and the metallic plate 9 to encapsulate and mechanically protect the pellets 6a, 7a and 8a. Numerals 15 and 16 designate capacitor mounting tapped holes which are provided in the cover means 13. Numeral 17 designates a commutating thyristor having a current rating of about 30 A, and 18 an inverting diode. These elements constitute the small capacity semiconductor devices 17 and 18. The small capacity semiconductor devices 17 and 18 are of a type commercially available, that is, each thereof has a pellet covered with a sealed case 19 made of ceramic or the like and a stud bolt 20 provided below the case 19. The small capacity semiconductor devices 17 and 18 are mounted on the metallic plate 9 by screwing the stud bolts 20 into the tapped holes provided in the metallic plate 9.

Figure 4:
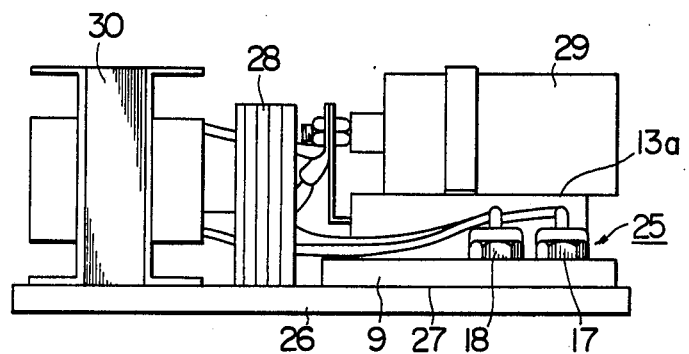
FIGS. 4 and 5 are respectively an elevation and a plan view of the first embodiment of the apparatus of this invention.
Figure 5:
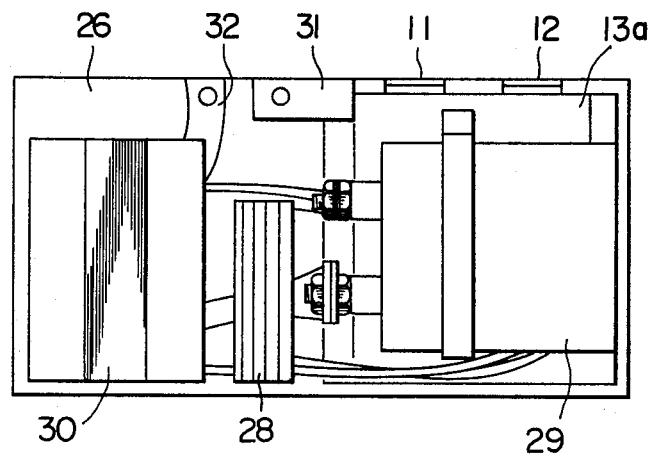

The abovementioned assembly of semiconductor devices, namely, a power module 25 (shown in FIGS. 2 and 3), is mounted in the following manner, as illustrated in FIGS. 4 and 5 showing the overall construction of the chopper apparatus. In FIGS. 4 and 5, numeral 26 designates a metal plate member constituting a base of the chopper apparatus and it is made of an aluminum plate or a copper plate having good heat dissipating properties. Numeral 27 designates an electrical insulating thin film including a thin mica sheet, a thin ceramic sheet, an adhesive, etc. and the thin film 27 is made thin so that the metal plate member 26 and the metallic plate 9 are electrically insulated from each other and at the same time the transmission of heat from the metallic plate 9 to the metal plate member 26 is not impeded.

Numeral 28 designates a commutating reactor, 29 a commutating capacitor, 30 an inverting current transformer, and 31 and 32 copper bars constituting electrodes.

With respect to the above described construction, since the operation of the chopper apparatus as a whole is well known, a detailed explanation thereon will be omitted. The main thyristor 6 is connected in series with the armature 1 and the field coil 2 of the electric vehicle driving DC motor and the DC power source 5 thereby to constitute a main circuit and to switch on and off an electric current flowing through the motor. The flywheel diode 7 is connected in parallel with the motor and operates to supply a smoothed electric current to the motor during the off-periods of the main thyristor 6. On the other hand, the plugging diode 8 is connected in parallel with the motor and operates to short-circuit the armature 1 during the time periods of the plugging braking (reversing braking) of the vehicle.

Further, since the large capacity semiconductor devices 6, 7 and 8 in the above embodiment are mounted on the metallic plate 9 generally in the form of pellets only, the heights of the large capacity semiconductor devices 6, 7 and 8 can be made short. Also, the horizontal dimensions of the large capacity semiconductor devices 6, 7 and 8 can be made small, resulting in a reduction in the mutual distance of the large capacity semiconductor devices 6, 7 and 8 and hence in a great reduction in the volume of the assembly 25 of the semiconductor devices as a whole. Further, the large capacity semiconductor devices 6, 7 and 8 are used generally in the form of pellets only without having any accessories such as stud bolts, cases, etc. attached thereto, thereby resulting in a reduction in their cost.

Further, by flattening an upper surface 13a of the cover means 13 covering the large capacity semiconductor devices 6, 7 and 8, it is possible to install auxiliary electric devices such as the commutating capacitor 29, etc. on the flat upper surface 13a. On the other hand, differently from the large capacity semiconductor devices 6, 7 and 8 which are constituted by pellets only, the small capacity semiconductor devices 17 and 18 of a commercially available type equipped with the case 19 and the stud bolt 20 are used. This is because the current capacities of the small capacity semiconductor devices 17 and 18 are extremely small as compared with those of the large capacity semiconductor devices, 6, 7 and 8, so that there is less merit in mounting the semiconductor devices 17 and 18, which are constituted only by pellets, directly on the metallic plate 9.

With respect to heat dissipation of the semiconductor devices 6, 7, 8, 17 and 18, the heat from the pellets 6a, 7a and 8a of the large capacity semiconductor devices 6, 7 and 8 is transmitted directly to the metallic plate 9, from which the heat is dissipated to the metal plate member 26 through the electrically insulating thin film 27. On the other hand, each of the small capacity semiconductor devices 17 and 18 is provided with the case 19 and the stud bolt 20, which renders the heat dissipating properties thereof inferior to those of the large capacitor semiconductor devices 6, 7 and 8, because the heat is transmitted to the metallic plate 9 through the case 19 and the stud bolt 20. However, this gives rise to no problem because of their small current carrying capacities.

Figure 1:
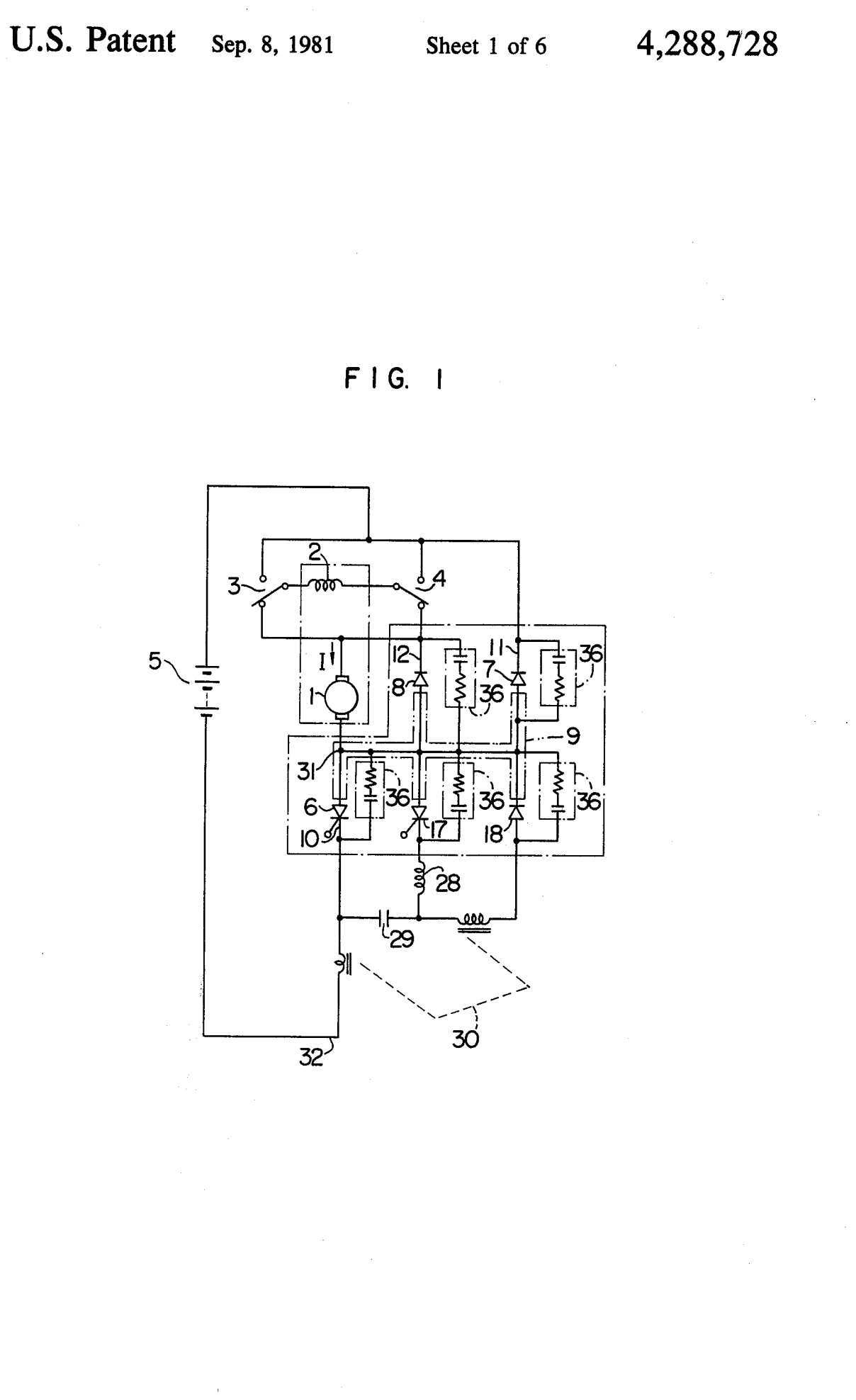

The electric circuit of the abovementioned first embodiment has a construction such as shown in FIG. 1. Since the anodes of the large capacity semiconductor devices 6, 7 and 8 are connected to the single metallic plate 9, which operates as a common electrode (shown by hatched portions), it is possible to simplify the construction and to increase the heat dissipating area as compared with the case where each of the semiconductor devices 6, 7 and 8 is provided with an independent metallic plate.

While in the abovementioned first embodiment the commutating capacitor 29 is mounted on the flat cover means 13, any one of other auxiliary electric devices including the inverting current transformer 30, the commutating reactor 28 and a gate control device may be mounted in place of the capacitor 29.

Next, an explanation will be given on the heat dissipating effect of the heat sink 9 and the manner of heat generation by the pellets 6a, 7a and 8a in the abovedescribed embodiment.

Figure 9:
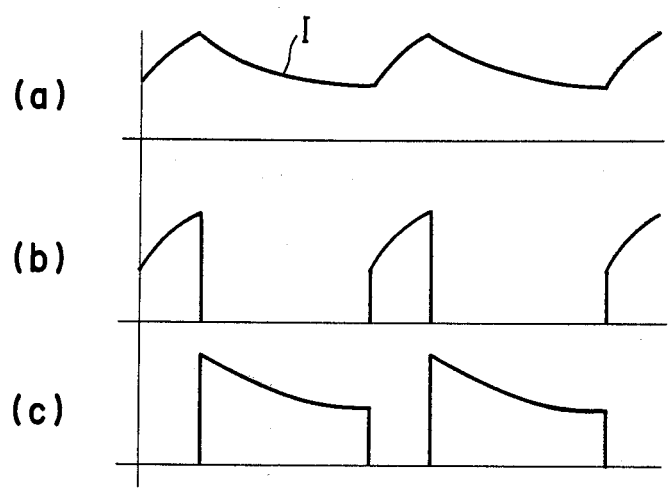
FIGS. 9 and 10 are waveform diagrams for currents flowing at various parts of the circuit shown in FIG. 1.
Figure 10:
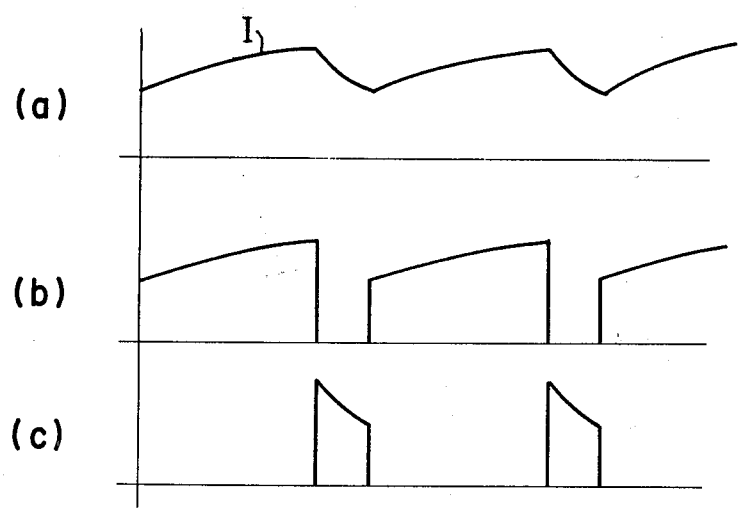

In the thyristor chopper for the electric vehicle driving DC motor 1, the load is inductive, and consequently the currents flowing through the main thyristor 6 and the flywheel diode 7 have the waveforms shown at (b) and (c) of FIG. 9, respectively. In this case, a load current, namely, a current indicated by an arrow I in FIG. 1, varies as shown at (a) of FIG. 9. The heat generated by the currents flowing through the main thyristor 6 and the flywheel diode 7, respectively, varies with time substantially in the same manner as the variations with time of the current flowing through the devices 6 and 7, respectively. Consequently, the heat generated by the main thyristor 6 and the flywheel diode 7, respectively, varies with time substantially in the same manner as the waveforms shown at (b) and (c) of FIG. 9, respectively. The load current I is changed frequently depending on the weight of the vehicle, the road conditions (uphill and downhill slopes, etc.), the operation of an accelerator pedal by a driver and so on. The waveforms shown at (a), (b) and (c) of FIG. 10 illustrate another case where a load current I varying with time in a manner different from the abovedescribed case flows through the DC motor 1, and in this case the pattern of heat generation by the main thyristor 6 becomes as shown at (b) of FIG. 10 and that of the flywheel diode 7 becomes as shown at (c) of FIG. 10.

It will thus be seen that, irrespective of the manner in which the load current I varies, the amount of heat generation by the flywheel diode 7 decreases with an increase in the amount of heat generation by the main thyristor 6 and conversely the amount of heat generation by the main thyristor 6 decreases with an increase in the amount of heat generation by the flywheel diode 7. Thus, the heat generation by the two devices has a complementary relation with each other.

Further in this embodiment, by virtue of the fact that the main thyristor 6 and the flywheel diode 7 are mounted on the heat sink 9 in the form of the pellets 6a and 7a and that the pellets 6a and 7a are not mounted on the heat sink 9 through cases and stud bolts as in the case of prior art apparatuses, a thermal impedance of the heat conducting path from the pellet 6a of the main thyristor 6 to the heat sink 9 is substantially equal to that of the heat conducting path from the pellet 7a of the flywheel diode 7 to the heat sink 9. Further, since there is no intervening element between the pellets 6a and 7a and the heat sink 9, as mentioned above, both thermal impedances are extremely low. Thus, since the heat generated in each of the pellets 6a and 7a in a complementary manner is quickly transmitted to the heat sink 9 and since the thermal impedances are substantially equal to each other, both of the amount of heat transmitted into the heat sink 9 and the amount of heat dissipated through the heat sink 9 have a complementary relationship. Consequently, for example, when the DC motor 1 is in an operating condition where a large amount of heat from the main thyristor 6 is stored in and dissipated from the heat sink 9, the amount of heat generated by the flywheel diode 7 is small. As a result, it is possible to maintain the pellets 6a and 7a of the main thyristor 6 and the flywheel diode 7, respectively, at relatively low temperatures even with a heat sink 9 having a small volume.

In contrast therewith, in the case where a main thyristor with a stud and a flywheel diode with a stud of a type used generally in choppers of this kind are screwed into a common heat sink, a difference in the rated currents between the main thyristor and the flywheel diode gives rise to a difference in the sizes of their stud bolts and their cases disposed on the stud bolts and containing the pellets, etc., so that the thermal impedances do not have the same value, but take considerably unbalanced values. Besides, the thermal impedances will have relatively high values. As a result, even through the heat generation by the main thyristor and the flywheel diode takes place in a complementary mode, there can be established no ideal complementary relation between the amount of heat transmitted into the common heat sink and that dissipated therefrom, and undesirable local heat storage will occur in the cases, etc. of the main thyristor and the flywheel diode, thereby raising temperatures of the pellets comparatively.

It will be apparent also from this fact that the mounting, on the heat sink 9, of the flywheel diode 7 and the main thyristor 6 in the form of only the pellets 7a and 6a, respectively, that is, the mounting of the devices in the bare form without stud bolts and cases contributes to decrease the volume of the heat sink 9 and to lower temperatures of the pellets 6a and 7a.

Figure 6:
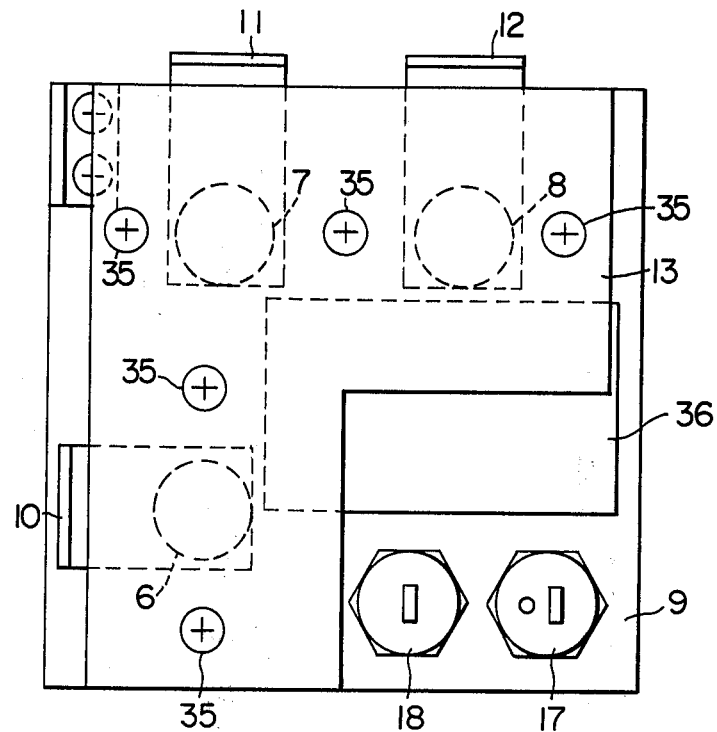
FIGS. 6 and 7 are respectively a plan view and an elevation showing an assembly of semiconductor elements used in a second embodiment of the apparatus of this invention.
Figure 7:
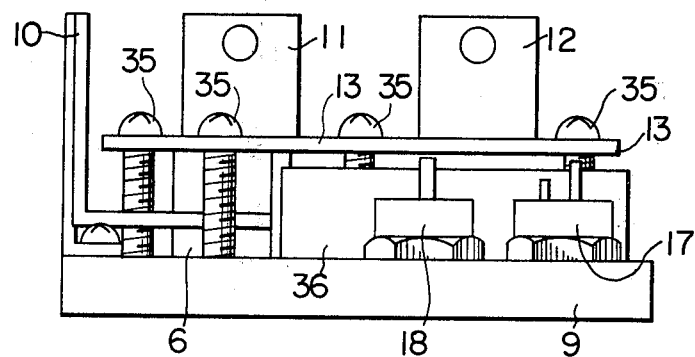

A second embodiment of the invention will now be described with reference to FIGS. 6 and 7. In the Figures, numeral 13 designates cover means made, in particular, of an iron plate, and large capacity semiconductor devices 6, 7 and 8 in the pellet form together with spring members are held between the iron plate 13 and a metallic plate 9. A plurality of screws 35 are provided between the iron plate 13 and the metallic plate 9 so that, when the screws 35 are tightened, the iron 13 is urged toward the metallic plate 9 to press the large capacity semiconductor devices 6, 7 and 8.

Numeral 36 dessignates a surge absorbing circuit comprising, in particular, resistors and capacitors, and the circuit is disposed between the iron plate 13 and the metallic plate 9.

With the construction of the above described second embodiment, the provision of the surge absorbing circuit 36 among the large capacity semiconductor devices 6, 7 and 8 on the metallic plate 9 brings the effect of reducing the length of wires connecting the surge aborbing circuuit 36 to the semiconductor devices 6, 7, 8, 17 and 18 and decreasing inductances of the wires and thereby ensuring improved surge absorbing action. While the second embodiment has been described with respect to a case where an auxiliary electric component is the surge absorbing circuit 36, any other auxiliary electric component, such as an overheat preventing temperature detecting element, may also be provided, and in this case ambient temperatures of the semiconductor devices 6, 7 and 8 can be accurately detected. Further, if the surge absorbing circuit 36 is replaced by a noise suppressing circuit, which is connected between the gate and cathode of the thyristor, it is possible to similarly eliminate any trouble caused by undesirable inductances. Further, other auxiliary electric components, such as a current detecting circuit employing a magnetic sensing element including a Hall generator element, a magnetic resistance element, etc., may be used.

Figure 8:
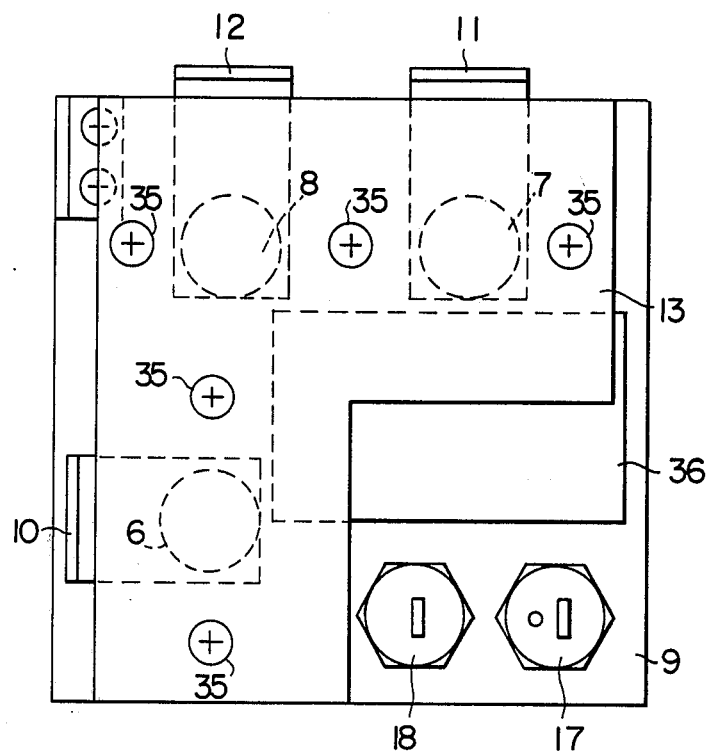
FIG. 8 is a plan view showing an assembly of semiconductor elements used in a third embodiment of the apparatus of this invention.

Next, a third embodiment of the invention will be described with reference to FIG. 8. In the Figure, numeral 6 designates a main thyristor, 7 a flywheel diode, and 8 a plugging diode. The embodiment shown in FIG. 8 differs from that shown in FIG. 6 only in that the positions of the flywheel diode 7 and the plugging diode 8 are interchanged with each other. As a result, in this embodiment the main thyristor 6 and the flywheel diode 7 are positioned along a diagonal line on the heat sink 9 thereby to be positioned sufficiently apart from each other, and thus the two devices, which continue to generate heat during the driving of the vehicle, are kept apart from each other, thereby making it possible to prevent the concentration of heat in the heat sink 9 and to improve the heat dissipating action.

It is to be noted that the plugging diode generates heat only during the plugging braking operation.

While, in the first, second and third embodiments, the large capacity semiconductor devices 6, 7 and 8 include the plugging diode 8, some electric vehicles lack the plugging diode 8, and in such a case the apparatus of this invention can be completed by the remaining devices such as the large capacity semiconductor devices 6 and 7. In all of the first, second and third embodiments it has been described that the cover means 13 is made of a metallic material, however, it may be made of a synthetic resin. Further, the pellets 6a, 7a and 8a constituting the large capacity semiconductor devices 6, 7 and 8 and parts of the connecting terminals 10, 11 and 12 may be molded with such a synthetic resin. In this case, the molding material or the synthetic resin plays the role of the cover means 13.

Further, it has been described that each of the connecting terminals 10, 11 and 12 is made of a copper bar, however, electric wires, flexible braided wires or a lamination of a number of thin copper plates may be used to prevent any harmful stress due to thermal deformation from being produced in the pellets 6a, 7a and 8a. It is of course possible that the cover means 13 may be enlarged to cover the small capacity semiconductor devices 17 and 18. Further, some auxiliary electric components such as the inverting current transformer 30 and the commutating reactor 28 may be dispensed with according to the type of electric vehicles. Still further, the first, second and third embodiments include the small capacity semiconductor devices 17 and 18 of a commercially available type having the stud bolts 20 and the devices 17 and 18 are installed in a way different from that of the large capacity semiconductor devices 6, 7 and 8 which are fabricated mainly in the form of pellets. This construction is advantageous in that, when any change of the circuit is made between products including such a circuit which requires to change the ratings of the small capacity semiconductor devices 17 and 18, the change may be easily met by simply changing the easily replaceable small capacity semiconductor devices having stud bolts, which is convenient in the case of manufacturing many kinds of choppers.

The term "pellet" used in this invention includes not only silicon and other semiconductor wafers (pellets proper) themselves but also those equipped with accessory plates made of molybdenum, tungsten, etc. for protecting semiconductor wafers from thermal stress.

Further, a transistor or a gate-turnoff thyristor may be used as the main semiconductor device in place of a thyristor. In this case, small capacity semiconductor devices, a commutating reactor, a commutating capacitor and an inverting current transformer are not always necessary, but a device for controlling a main semiconductor device (a device for supplying a control signal to a base or a gate) becomes necessary as an auxiliary electric component.

The term "case" used hereinabove includes those which are the same with or equivalent to a container made of a ceramic insulating material, etc. to be used to enclose and hermetically seal a copper base and a pellet on the copper base used in commercially available stud type thyristors or the like.

We claim:

1. An electric vehicle control apparatus, which includes at least a main thyristor for chopping a direct current flowing through an electric vehicle driving DC motor and a flywheel diode connected in parallel with said DC motor to form a path for conducting a flywheel current therethrough when said main thyristor is nonconductive, and which is fixed onto an electric vehicle body, comprising:
   (A) a base member of said electric vehicle control apparatus fixed onto said vehicle body being in close contact therewith;
   (B) a heat sink made of a metallic plate and fixed onto a portion of said base member through a thin sheet of an insulating material intervening therebetween, said heat sink has a substantially square shape;
   (C) at least two substantially bare semiconductor pellets fixed directly onto said heat sink, each of said pellets being mounted on said heat sink, each of said pellets being mounted on said heat sink near one of four corners of said heat sink, and small capacity semiconductor devices are mounted on said heat sink near the remaining one of said four corners, said pellets constituting at least said main thyristor, said flywheel diode and a plugging diode;
   (D) a plurality of connecting terminals each constituted by an L-shaped metallic bar which is mounted on one of said pellets and extends horizontally away from the pellet to which it is mounted and then bends upward leaving a suitable length of the horizontal portion thereof; and
   (E) at least one auxiliary electric device fixed onto said base member.

2. An apparatus according to claim 1, wherein said pellets are molded with an insulating synthetic resin material.

3. An apparatus according to claim 2, wherein each of said L-shaped metallic bar constituting each one of said connecting terminals projects from a side of each of said molded members molded with said insulating synthetic resin material.

4. An apparatus according to claim 1, further comparising a pressure plate disposed above said connecting terminals on said pellets, whereby said pellets are held between said pressure plate and said heat sink, and wherein said pressure plate and said heat sink are interlinked with each other through locking bolts.

5. An apparatus according to claim 4, wherein said thyristor device and said flywheel diode are positioned substantially along one and the same diagonal line on said heat sink.

6. An apparatus according to claim 1, wherein at least one of said pellets is connected to at least one electric component comprising an element selected from a noise suppressing circuit, surge absorbing circuit, overheat preventing temperature detecting element and current detecting circuit, and said at least one electric component is mounted on said heat sink near at least one of said pellets.

7. An apparatus according to claim 2, wherein an upper portion of each of said molded members is formed to have a substantially flat shape, each of said connecting terminals projects from a side of each of said molded members, and said at least one auxiliary electric device is disposed above said molded members.

8. An apparatus according to claim 7, wherein said at least one auxiliary electric diode device is a commutating capacitor.

9. An apparatus according to claim 4, wherein said at least one auxiliary electric device is mounted on an upper portion of said pressure plate.

10. An apparatus according to claim 9, wherein said at least one auxiliary electric device is a commutating capacitor.

11. An apparatus according to claim 6, wherein said heat sink has a substantially square shape, said pellets comprise a thyristor device, a flywheel diode and a plugging diode, each of said pellets being mounted on said heat sink near one of four corners of said heat sink, small capacity semiconductor devices are mounted on said heat sink near the remaining one of said four corners, and at least one electric compoment comprising an element selected from said noise suppressing circuit, surge absorbing circuit, overheat preventing temperature detecting element and current detecting circuit is mounted on said heat sink at a substantially central portion thereof.

12. An electric vehicle control apparatus, which includes at least a main thyristor for chopping a direct current flowing through an electric vehicle driving DC motor and a flywheel diode connected in parallel with said DC motor to form a path for conducting a flywheel current therethrough when said main thyristor is nonconductive, and which is fixed onto an electric vehicle body, comprising:

a base member of said electric vehicle control apparatus fixed onto said vehicle body being in close contact therewith, a heat sink made of a metallic plate and fixed onto a portion of said base member through a thin sheet of an insulating material intervening therebetween, said heat sink has a substantially square shape, at least two substantially bare semiconductor pellets fixed directly onto said heat sink, each of said pellets being mounted on said heat sink near one of four corners of said heat sink, and small capacity semiconductor devices are mounted on said heat sink near the remaining one of said four corners, said pellets constituting at least said main thyristor, said flywheel diode and a plugging diode, a plurality of connecting terminals each constituted by an L-shaped metallic bar which is mounted on one of said pellets and extends horizontally away from the pellet to which it is mounted and then bends upward leaving a suitable length of the horizontal portion thereof, and at least one auxiliary electric device fixed onto said base member, said pellets being molded with an insulating synthetic resn material, wherein each of said L-shaped metallic bars constituting each one of said connecting terminals projects from a side of each of said molded members molded with said insulating synthetic resin material.

* * * * *